(12) United States Patent
Bikumandla (10) Patent No.: US 10,438,986 B1
(45) Date of Patent: Oct. 8, 2019

(54) APPARATUSES, SYSTEMS, AND METHODS FOR SELECTIVELY SUPPRESSING AMBIENT LIGHT IN AN IMAGE SENSOR

(71) Applicant: FACEBOOK TECHNOLOGIES, LLC, Menlo Park, CA (US)

(72) Inventor: Manoj Bikumandla, Union City, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 101 days.

(21) Appl. No.: 15/814,123

(22) Filed: Nov. 15, 2017

(51) Int. Cl.
*H01L 27/00* (2006.01)
*H01L 27/146* (2006.01)
*G02B 27/01* (2006.01)
*G01S 7/486* (2006.01)

(52) U.S. Cl.
CPC ...... *H01L 27/14636* (2013.01); *G01S 7/4863* (2013.01); *G02B 27/017* (2013.01); *H01L 27/1463* (2013.01); *H01L 27/1464* (2013.01); *H01L 27/14625* (2013.01); *H01L 27/14685* (2013.01)

(58) Field of Classification Search
CPC .......... H01L 27/14625; H01L 27/1463; H01L 27/14636; H01L 27/1464; H01L 27/14685; G02B 27/017
USPC ................................. 250/208.1, 216
See application file for complete search history.

(56) References Cited

U.S. PATENT DOCUMENTS 10,181,200 B1 * 1/2019 Chao ...................... G06T 7/521

* cited by examiner

*Primary Examiner* — Kevin K Pyo
(74) *Attorney, Agent, or Firm* — FisherBroyles, LLP (57) ABSTRACT

An imaging device may include (1) an aperture, (2) a lens positioned to direct light received through the aperture to a front side of an image sensor; and (3) the image sensor. The image sensor may include (1) a light capture layer including a photosensitive material that is dimensioned such that (a) a first portion of the light having less than a predetermined wavelength is captured by the light capture layer, producing a current, and (b) a second portion of the light having at least the predetermined wavelength passes through the light capture layer, (2) a conduction pathway that conducts the produced current to a current sink, and (3) an image sensor layer that includes at least one image sensor element positioned to receive the second portion of the light that passes through the light capture layer. Various other devices, systems, and methods are also disclosed.

20 Claims, 7 Drawing Sheets

APPARATUSES, SYSTEMS, AND METHODS FOR SELECTIVELY SUPPRESSING AMBIENT LIGHT IN AN IMAGE SENSOR

BACKGROUND

Augmented reality and virtual reality systems may rely on imaging devices, such as cameras and/or sensors, for various computer vision purposes, including time-of-flight (ToF) depth sensing, device tracking, and/or simultaneous localization and mapping (SLAM). A conventional imaging device in such systems may project light into an area and determine the location and/or orientation of objects within the area based on light backscattered from the objects after the light has been projected and/or based on light emitted from portions of the objects (e.g., light emitted by light emitting diodes on the objects). However, background ambient light and/or light of specific wavelength bands (e.g., visible light) may interfere with image sensor measurements. For example, background ambient light may negatively impact a signal-to-noise ratio of an image sensor. While conventional optical filtering techniques may be used to limit ambient light interference in some conventional image sensors, implementation of conventional filtering mechanisms within these specialized augmented and virtual reality systems may introduce prohibitive costs into the design and construction process. Also, although background light may be accounted for at the circuit level by, for example, background light subtraction algorithms, such techniques may limit the overall collection efficiency of image sensors. Thus, the instant disclosure identifies and addresses a need for improved apparatuses, systems, and methods for selectively suppressing various light components, including ambient light, received by imaging devices in augmented and virtual reality environments.

SUMMARY

As will be described in greater detail below, the instant disclosure describes various apparatuses, systems, and methods for selectively suppressing ambient light in an image sensor such as a back-side illuminated ToF sensor. For example, the disclosed system may convert ambient light (e.g., light having shorter than a predetermined wavelength) to an electrical current before the ambient light reaches an image sensor element configured to detect a particular portion of the electromagnetic spectrum (e.g., light having at least the predetermined wavelength, such as infrared light, near-infrared light, etc.). This may prevent the ambient light from interfering with detection of the particular portion of the electromagnetic spectrum, and may therefore improve a signal-to-noise ratio of the image sensor in conditions with potential ambient light interference.

In one example, an imaging device may include (1) an aperture, (2) a lens positioned to direct light received through the aperture to a front side of an image sensor, and (3) the image sensor. In this example, the image sensor may include a light capture layer that may further include a photosensitive material that is dimensioned such that (1) a first portion of the light having less than a predetermined wavelength is captured by the light capture layer, producing a current in the light capture layer, and (2) a second portion of the light having at least the predetermined wavelength passes through the light capture layer. In such an example, the image sensor may also include a conduction pathway, electrically coupled to the light capture layer, that conducts the current produced in the light capture layer to a current sink. The image sensor may further include an image sensor layer coupled to the light capture layer, and the image sensor layer may include at least one image sensor element positioned to receive the second portion of the light that passes through the light capture layer.

In some examples, the current sink may include at least one of (1) a grounding terminal, (2) an open current drain, (3) an open current collector, or (4) a capacitor. In some examples, the current sink may conduct the current produced in the light capture layer out of the imaging device without detecting the current. In at least one example, the imaging device may include image sensor circuitry electrically coupled to the at least one image sensor element, and the current sink may not be electrically coupled to the image sensor circuitry.

In some embodiments, the light capture layer may include an n-type semiconductor, the image sensor layer may include a p-type semiconductor, and the image sensor element may include an additional n-type semiconductor disposed at least partially within the p-type semiconductor.

In some examples, the image sensor may further include an incident layer coupled to the light capture layer and positioned between the lens and the light capture layer. In such examples, the incident layer may pass the light from the lens to the light capture layer. In additional examples, the incident layer may include an additional p-type semiconductor.

In some embodiments, the image sensor layer may include a plurality of image sensor elements. In such embodiments, the at least one image sensor element may be included in the plurality of image sensor elements. Additionally, in some examples, the light capture layer may overlap the plurality of image sensor elements. In some examples, the image sensor element may have a greater thickness in a direction of light flow through the image sensor than the light capture layer.

In at least one embodiment, the imaging device may further include a printed circuit board positioned behind the image sensor and electrically coupled to the at least one image sensor element.

In at least one example, the imaging device may be included as part of a local area imaging assembly configured to track at least one object in an area surrounding the local area imaging assembly. In some examples, the imaging device may be part of a local area imaging assembly configured to determine a depth between the local area imaging assembly and one or more objects in an area surrounding the local area imaging assembly. In some additional examples, the imaging device may be included as part of (1) a virtual reality headset, or (2) an augmented reality headset.

In addition, a corresponding system may include a head-mounted display and an imaging device that includes one or more of the features described above (e.g., an aperture, a lens positioned to direct light received through the aperture to a front side of an image sensor, and the image sensor). In one embodiment, the system may also include a local area imaging assembly that includes the imaging device and an illumination source that emits light onto one or more objects in a local area such that the emitted light is reflected back to the local imaging assembly after reaching the one or more objects. In such an embodiment, (1) the light received through the aperture may include the light reflected back from the one or more objects, and (2) the local area imaging assembly may be configured to determine a depth between the local area imaging assembly and the one or more objects based on the light reflected back from the one or more objects.

In some examples, the system may include a hand-held controller that includes at least one light-emitting element. In such examples, the light received through the aperture includes light emitted by the at least one light-emitting element of the hand-held controller. The imaging device may be part of a local area imaging assembly configured to track the hand-held controller based on the light emitted by the at least one light-emitting element of the hand-held controller.

In addition, a corresponding method may include forming a light capture layer on a front side of an image sensor layer that includes at least one image sensor element. The light capture layer may include a photosensitive material that is dimensioned such that (1) a first portion of light received through an aperture having less than a predetermined wavelength is captured by the light capture layer, producing a current in the light capture layer, and (2) a second portion of the light having at least the predetermined wavelength passes through the light capture layer to the at least one image sensor element. The method may further include electrically coupling a conduction pathway to the light capture layer that conducts the current produced in the light capture layer to a current sink. The method may further include positioning the image sensor layer and the light capture layer within an imaging device behind a lens positioned to direct light received through the aperture of the imaging device to the light capture layer.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to apparatuses, systems, and methods for selectively suppressing ambient light in an image sensor such as a back-side illuminated ToF sensor. As will be explained in greater detail below, embodiments of the instant disclosure may include a local area imaging assembly for a headset, such as a virtual reality and/or augmented reality headset.

The local area imaging assembly may include an imaging device, such as a camera, that captures light from a local area and prevents portions of the light (e.g., ambient light) from interfering with detection of a particular portion of an electromagnetic spectrum included in the light, such as infrared (IR) or near-infrared (NIR) light. An image sensor (e.g., a back-side illuminated time-of-flight sensor) included in the imaging device may include a light capture layer that includes a photosensitive material. The light capture layer may be dimensioned such that light having less than (e.g., a wavelength shorter than) a predetermined wavelength (e.g., ambient light) is captured by the light capture layer and converted to an electric current that is transferred via a conduction pathway to a current sink and, in some examples, removed from the imaging device. This may allow a second portion of the light having at least (e.g., a wavelength equal to or longer than) the predetermined wavelength (e.g., IR light, NIR light, etc.) to pass through the light capture layer to an image sensor element positioned to receive and/or detect the second portion of the light.

The light capturing features described herein may reduce and/or eliminate the need for an ambient-light-blocking filter in the imaging device. The light capturing features may also obviate the need for background light subtraction algorithms to remove ambient light, increasing the light collection efficiency of the imaging device. Thus, the disclosed light capturing features may improve a signal-to-noise ratio of an imaging device in conditions with potential ambient light interference while reducing costs associated with additional light-blocking elements.

By way of illustration, when ambient light interferes with an image sensor, a signal-to-noise ratio for the image sensor may be calculated in accordance with the following equation:

$$SNR_{AMBIENT} = \frac{\text{Signal}}{\sqrt{\text{Signal}^2 + \text{Ambient}^2}}$$

where $SNR_{AMBIENT}$ represents the signal-to-noise ratio of the image sensor when ambient light is included, Signal represents an amount of signal attributable to non-ambient light, and Ambient represents an amount of signal attributable to ambient light. Conversely, when ambient light is eliminated as described herein, the signal-to-noise ratio for the image sensor may be calculated in accordance with the following equation:

$$SNR = \frac{\text{Signal}}{\sqrt{\text{Signal}^2}}$$

where SNR represents the signal-to-noise ratio of the image sensor when ambient light is excluded and Signal represents an amount of signal attributable to non-ambient light. By capturing and eliminating ambient light before it may interfere with an image sensor element, embodiments of the present disclosure may therefore improve a signal-to-noise ratio of an image sensor (e.g., a ToF depth sensor) in conditions with potential ambient light interference.

The following will provide, with reference to FIGS. 1-6, detailed descriptions of exemplary artificial reality systems, imaging devices, headsets, local area imaging assemblies, and image sensors that may selectively allow light to pass through a light capture layer to an image sensor element. In addition, the discussion corresponding to FIG. 7 will provide an exemplary method for constructing an image sensor that includes a light capture layer that captures, and converts to electrical current, particular wavelengths of light, while allowing other wavelengths to reach an image sensor element.

Figure 1:
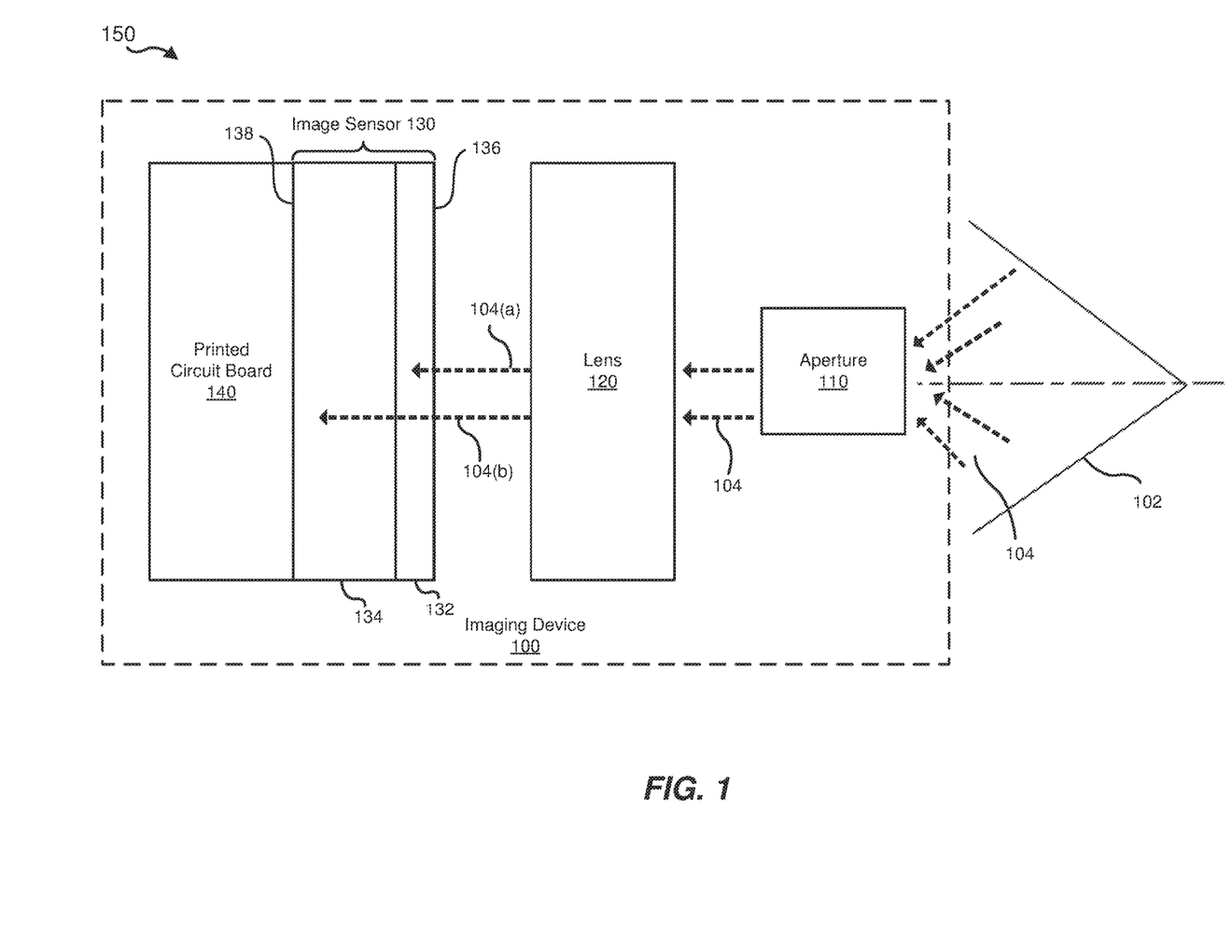
FIG. 1 is a block diagram of an exemplary imaging device, in accordance with an embodiment.

FIG. 1 illustrates an exemplary system, such as an artificial reality system 150, that includes an imaging device 100. As shown in FIG. 1, imaging device 100 may be configured for imaging a local area 102 surrounding some or all of imaging device 100. In some examples, local area 102 may represent an indoor environment. In other examples, local area 102 may represent an outdoor environment. Imaging device 100 may include a variety of elements, including (without limitation) an aperture 110, a lens 120, an image sensor 130, and a printed circuit board 140. Aperture 110 may receive light 104 from local area 102 and lens 120 may be positioned behind aperture 110 to direct light 104 to a front side of image sensor 130. Additionally or alternatively, aperture 110 may be positioned between lens 120 and image sensor 130 and/or may be positioned within lens 120 (for example, aperture 110 may be positioned between two or more lens elements of lens 120). In some embodiments, printed circuit board 140 may include one or more components that interface with and/or control aperture 110, lens 120, and/or image sensor 130. In some examples, as will be described later in connection with FIG. 5, light 104 may include ambient light (e.g., ambient light 104(a)) as well as light that has been backscattered from one or more objects in local area 102 after having been emitted into local area 102 by an illumination source (e.g., infrared light 104(b)).

In some examples, aperture 110 may be an opening in an imaging device through which light may travel. In some examples, lens 120 may be an optical assembly that focuses and/or disperses light by means of refraction. In some examples, lens 120 may refer to a single piece of transparent material. In other examples, lens 120 may refer to an assembly of several lenses (e.g., arranged along a common axis).

In some examples, image sensor 130 may be an integrated circuit that includes an array of light sensors (e.g., light-sensing photodiode elements) that capture and measure light. In some examples, the array of light sensors may capture particular ranges of wavelengths of light (i.e., "bands" of light) (e.g., approximately 400 nm to approximately 900 nm). In some embodiments, artificial reality system 150 may distinguish between certain components of light captured by the array of light sensors. For example, as will be described in greater detail below, artificial reality system 150 may distinguish between a range of light wavelengths in a visible band between, for example, approximately 400 nm to approximately 700 nm and a range of light wavelengths in an IR band between, for example, greater than approximately 700 nm to approximately 900 nm. In one embodiment, the array of light sensors may include complementary metal-oxide-semiconductor (CMOS) image sensors and/or charge-coupled device (CCD) image sensors. In some examples, the array of light sensors may be supported within the image sensor array on and/or within a silicon die.

In some examples, a printed circuit board 140 may include a non-conductive material, such as a plastic or glass-fiber substrate, that mechanically supports and/or electrically connects electronic components. In some examples, conductive lines (e.g., copper traces) may be printed or etched on the non-conductive material.

In some examples, image sensor 130 may include a semiconductor material, such as a crystalline silicon die or substrate, having a front side and a back side. For example, as illustrated in FIG. 1, image sensor 130 may include a front side surface 136 and a back side surface 138. Light passing through aperture 110 and lens 120 illustrated in FIG. 1 may be incident on front side surface 136 of image sensor 130. A portion of light 104 (e.g., ambient light 104(a) shown in FIG. 2) may pass into, and be captured by, light capture layer 132. Another portion of light 104 (e.g., infrared light 104(b) shown in FIG. 2) may pass through light capture layer 132 into image sensor layer 134. In some examples, light (e.g., light 104) may be incident on a side of image sensor 130 (e.g., front side surface 136) that is not obscured by wiring (e.g., printed circuit board 140 and/or image sensor circuitry 212 in FIG. 2). In such examples, image sensor 130 may be referred to as a back-side illuminated sensor and/or a back-illuminated sensor.

Figure 2:
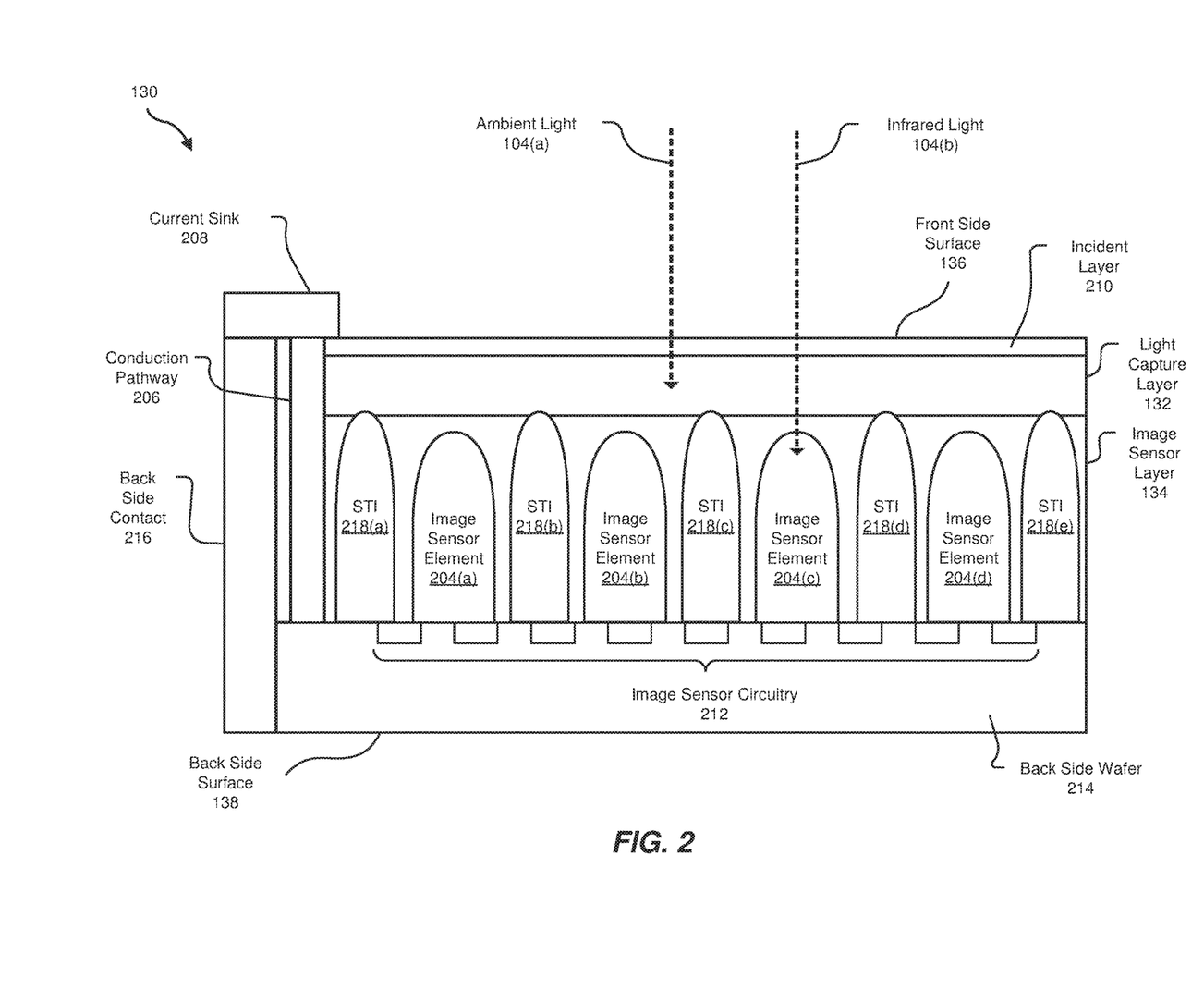
FIG. 2 is a cross-sectional side view of an exemplary image sensor that includes a light capture layer that captures ambient light and prevents ambient light from interfering with an image sensor element.
Figure 3:
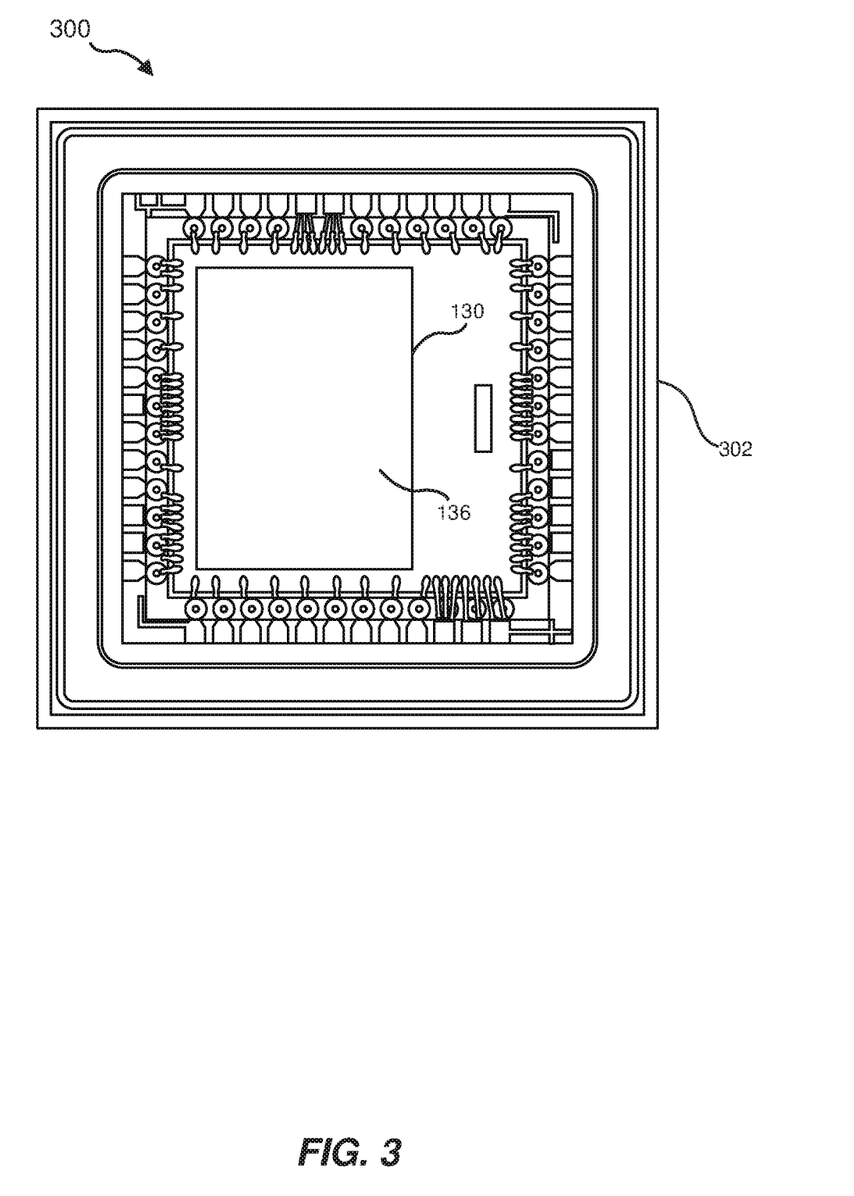
FIG. 3 is a front view of an exemplary image sensor device including an image sensor, in accordance with some embodiments.

FIG. 2 illustrates a detailed view of an example image sensor 130. As described above, image sensor 130 may include light capture layer 132, image sensor layer 134, and image sensor elements 204(a)-(d) disposed within image sensor layer 134. FIG. 3 illustrates a front view of an exemplary image sensor device 300 that may include one or more image sensor elements 204. Image sensor device 300 may represent any suitable image sensor, such as an active-pixel sensor (e.g., a CMOS sensor, CCD sensor, etc.) including an array of image sensor elements 204. Image sensor device 300 may include an integrated circuit 302 that includes image sensor 130. FIG. 3 shows front side surface 136 of image sensor 130 at which an array of light sensor elements is disposed between a light capture layer (e.g., light capture layer 132) and a printed circuit board (e.g., printed circuit board 140). In some embodiments, additional features (e.g., wiring and/or other electrical components, insulation layers, light-blocking layers, etc.) may be disposed on front side surface 136 and/or any other suitable portion of image sensor 130.

Returning to FIG. 2, light capture layer 132 may include a photosensitive material, such as a doped semiconductor region of a silicon die or substrate forming image sensor 130 configured such that, when a photon of light having less than (i.e., a shorter wavelength than) a predetermined wavelength strikes and/or passes into light capture layer 132, the photon interacts with light capture layer 132 and causes an electric current to be produced in light capture layer 132. For example, the photon may interact with light capture layer 132 and create an electron-hole pair within light capture layer 132, which may result in generation an electric current within light capture layer 132. This interaction may result in the photon being captured and converted into electric current by the light capture layer. Thus, the photon may not pass through light capture layer into image sensor layer 134 and/or any of image sensor elements 204.

Light capture layer 132 may capture any suitable portion of light 104, and allow any other portion to pass through light capture layer 132 to image sensor layer 134. For example, light capture layer 132 may be configured to have a predetermined quantum efficiency (QE) over a predetermined range of wavelengths (e.g., a range of wavelengths up to the predetermined wavelength) such that a predetermined percentage of photons of light 104 (e.g., ambient light 104(a)) may be captured by light capture layer 132. A QE of light capture layer 132 may be represented by a fraction of photon flux of ambient light 104(a) that contributes to the production of current in light capture layer 132.

By way of illustration, ambient light 104(a) may, in some examples, be light in a range of wavelengths shorter than the predetermined wavelength, such as, for example, light with wavelengths up to about 780 nm (e.g., light with wavelengths up to about 600 nm, about 610 nm, about 620 nm, about 630 nm, about 640 nm, about 650 nm, about 660 nm, about 670 nm, about 680 nm, about 690 nm, about 700 nm, about 710 nm, about 720 nm, about 730 nm, about 740 nm, about 750 nm, about 760 nm, about 770 nm, about 780 nm, about 790 nm, about 800 nm, greater than about 800 nm). Light capture layer 132 may have an external and/or internal QE across this range of wavelengths that may meet or exceed a predetermined threshold, such as, for example, at least about 70% (e.g., a QE of at least about 70%, about 75%, about 80%, about 85%, about 90%, about 95%, greater than about 95%). This may indicate that light capture layer 132 may capture and convert light (i.e., photons) having wavelengths within the range of wavelengths perceptible by the human eye to electric current at a rate of at least about the predetermined threshold (e.g., at least about 90%). This may result in at least a part of ambient light 104(a), and in some examples a majority of ambient light 104(a), being captured by light capture layer 132 and converted into electrical current within light capture layer 132.

In some examples, light capture layer 132 may be configured such that light (e.g., photons) having greater than the predetermined wavelength (e.g., infrared light 104(b)) may not interact with, and thus may not be captured by, light capture layer 132. Infrared light 104(b) may include, for example, light with wavelengths of at least about 700 nm (e.g., light with wavelengths of at least about 700 nm, about 710 nm, about 720 nm, about 730 nm, about 740 nm, about 750 nm, about 760 nm, about 770 nm, about 780 nm, about 790 nm, about 800 nm, 810 nm, about 820 nm, about 830 nm, about 840 nm, about 850 nm, about 860 nm, about 870 nm, about 880 nm, about 890 nm, about 900 nm, greater than about 900 nm). Such light (e.g., photons of light) may thus pass through light capture layer 132 to image sensor layer 134. For example, light capture layer 132 may be dimensioned and configured such that light in the IR or NIR portion of the electromagnetic spectrum may be less likely to interact with light capture layer 132, and may pass through light capture layer 132 to image sensor layer 134. In other examples, light capture layer 132 may be configured to have an internal and/or external QE across a range of wavelengths longer than the predetermined wavelength (e.g., wavelengths included in infrared light 104(b)) that may be below another predetermined threshold (e.g., a QE of about 40% or less, about 35%, about 30%, about 25%, about 20%, about 15%, about 10%, about 5%, or less than about 5%). This may indicate that light capture layer 132 may capture and convert less light (i.e., photons) having wavelengths included within infrared light 104(b) to electrical current. This may result in at least a part of infrared light 104(b), and in some cases a majority of infrared light 104(b), passing through light capture layer 132 to image sensor layer 134.

As further shown in FIG. 2, light capture layer 132 may be electrically coupled to a conduction pathway 206, which may be further electrically coupled to a current sink 208. Conduction pathway 206 may be any suitable material, substance, and/or device that may conduct current produced in light capture layer 132 from light capture layer 132 to current sink 208. In at least one example, conduction pathway 206 may include a conductive metal material, a conductive silicon material (e.g., a doped silicon material), and/or any other suitable conductive material and may be coupled to light capture layer 132 via a suitable contact (e.g., a metal-substrate contact).

Current sink 208 may include any suitable electrical pathway and/or electrical storage device. In some examples, current sink 208 may be any point where current may exit an electrical system. In at least one embodiment, conduction pathway 206 may conduct current produced (e.g., by ambient light 104(a)) in light capture layer 132 toward a common return path for electrical current of image sensor 130 and/or imaging device 100 (e.g., a grounding terminal). In at least one implementation, current sink 208 may include an open current collector and/or an open current drain. In some examples, an "open current collector" may be an output of an electrical device (e.g., image sensor 130) that may be driven to one voltage (e.g., ground) by a transistor. For example, an n-channel transistor may pull signal from conduction pathway 206 to ground when the transistor is on (e.g., "open"). Similarly, in some examples, an "open current drain" may be an output of an electrical device (e.g., image sensor 130) that may be pulled to a predefined voltage (e.g., ground) by a field-effect transistor (FET). In some embodiments, current sink 208 may conduct current produced in light capture layer 132 out of image sensor 130 and/or out of imaging device 100 without current sink 208 or any other device detecting, sensing, measuring, or otherwise using current produced in light capture layer 132.

By way of illustration, as further shown in FIG. 2, current sink 208 may be further electrically coupled to a back side contact 216. Back side contact 216 may be an additional conduction pathway that, as described above, may conduct current generated in light capture layer 132 from current sink 208 to a suitable grounding contact. In some examples, back side contact 216 may conduct current from current sink 208 out of image sensor 130 and/or out of imaging device 100 without detecting, sensing, measuring, or otherwise using current produced in light capture layer 132. In some examples, back side contact 216 may be formed as part of a back side process where a back side of image sensor 130 (e.g., back side wafer 214, image sensor layer 134, light capture layer 132, and/or incident layer 210) may be etched to create a contact to light capture layer 132 that may be further connected to a suitable grounding point, such as a grounding point of image sensor circuitry 212.

By conducting current produced in light capture layer 132 to a current sink (e.g., to current sink 208 via conduction pathway 206), the current that may be produced within light capture layer 132 as a result of interaction of ambient light 104(a) with light capture layer 132 may be eliminated (e.g., drained) from image sensor 130 and/or imaging device 100 without otherwise interfering with the image sensing capabilities of imaging device 100. Thus, in some examples, the combination of light capture layer 132, conduction pathway 206, current sink 208, and, in some examples, back side contact 216, may be referred to as an "overflow drain" or "surface overflow drain."

Image sensor layer 134 may be coupled to light capture layer 132 and may include doped region of the substrate of image sensor 130. In some examples, image sensor layer 134 may include at least one image sensor element 204 positioned to receive a portion of light that passes through light capture layer 132. Image sensor layer 134 may be configured such that light that passes through light capture layer 132 is incident on at least one image sensor element 204 (i.e., at least one of image sensor elements 204(a)-(d)). As shown in FIG. 2, in some examples, image sensor layer 134 may include more than one image sensor element 204 (e.g., image sensor elements 204(a)-(d)).

According to some embodiments, image sensor elements 204(a)-(d) may each represent a light collecting photosensor (e.g., a photodiode, a photo transistor, etc.). Image sensor elements 204(a)-(d) may each, for example, include a doped semiconductor region of a silicon die or substrate forming image sensor 130. As a further example, image sensor elements 204(a)-(d) may include a doped semiconductor region of a silicon die or substrate forming image sensor layer 134. An electric field may be generated in each of image sensor elements 204(a)-(d) by a current passed through image sensor elements 204(a)-(d) by circuitry disposed on and/or in image sensor 130 and/or printed circuit board 140. For example, image sensor circuitry 212 may be electrically coupled to each of image sensor elements 204 (a)-(d) at back side surface 138 of image sensor layer 134. Image sensor circuitry 212 may include, for example, electrodes and/or wiring for applying an electric field to each of image sensor elements 204(a)-(d) and/or for receiving current generated by light photons interacting with image sensor elements 204(a)-(d). Various light components may be collected in image sensor elements 204(a)-(d) as light photons are converted into current. In some examples, image sensor elements 204(a)-(d) may be configured to collect components of light having at least a predetermined wavelength (e.g., a wavelength at least as long as the predetermined wavelength). For instance, image sensor elements 204(a)-(d) may be configured to collect light in an IR and/or NIR portion of the electromagnetic spectrum (i.e., infrared light 104(b)). In some embodiments, current and/or signals generated in image sensor elements 204(a)-(d) by light (e.g., infrared light 104(b)) may be relayed to printed circuit board 140 and/or to other image processing circuitry via, for example, image sensor circuitry 212. In at least one example, image sensor circuitry 212 may be included in (e.g., disposed within, electrically coupled to, etc.) back side wafer 214. Back side wafer 214 may be another doped region of the substrate of image sensor 130, and/or may be coupled to (e.g., via a suitable laminating process) image sensor layer 134.

Image sensor elements 204(a)-(d) may be dimensioned in any suitable way to efficiently collect light having at least (e.g., a wavelength longer than) a predetermined wavelength (e.g., infrared light 104(b)). For example, image sensor elements 204(a)-(d) may have a greater thickness in a direction of light flow (e.g., flow of light 104) through image sensor 130 than light capture layer 132. Such an arrangement may increase a likelihood that infrared light 104(b) (i.e., a photon of infrared light 104(b)) may interact with, and therefore be captured by, at least one of image sensor elements 204(a)-(d). This example arrangement may also reduce a likelihood that a photon in infrared light 104(b) may interact with, and therefore be captured by, light capture layer 132.

As further shown in FIG. 2, image sensor 130 may also include one or more shallow trench isolation (STI) regions (STI 218(a)-(e) in FIG. 2) disposed within image sensor layer 134. STI regions 218 may be disposed between image sensor elements 204, and may be configured to prevent current leakage between image sensor elements 204 (e.g., prevent leakage from image sensor element 204(a) to image sensor element 204(b), from image sensor element 204(b) to image sensor element 204(c), and so forth), and/or between any region or layer within image sensor 130. STI regions 218 may be formed in any suitable way, such as by etching a pattern of trenches in silicon (e.g., image sensor layer 134), depositing one or more dielectric materials (e.g., silicon dioxide) within the trenches, and removing excess dielectric material, such as by chemical-mechanical planarization. In some examples, STI regions 218 may be formed after image sensor layer 134 is back-thinned and prior to a coupling of back side wafer 214 to image sensor layer 134.

In some examples, image sensor 130 may also include an incident layer 210. Incident layer 210 may be coupled to light capture layer 132 and may be positioned between lens 120 in FIG. 1 and light capture layer 132. Incident layer 210 may pass light 104 from lens 120 to light capture layer 132. In some examples, incident layer 210 may be another doped region of the substrate of image sensor 130 (e.g., a p-type semiconductor layer).

As noted above, each of light capture layer 132, image sensor layer 134, image sensor elements 204, incident layer 210, and back side wafer 214 may include separate doped regions of the substrate of image sensor 130. In other embodiments, they may represent layers or regions of silicon coupled together via any suitable coupling mechanism. Each of these elements may be configured (e.g., doped) to be any suitable type of semiconductor. For example, in at least one embodiment, light capture layer 132 may include an n-type semiconductor, image sensor layer 134 may include a p-type semiconductor, and each image sensor element 204 (e.g., image sensor elements 204(a)-(d)) may include an additional n-type semiconductor that may be disposed at least partially within the p-type semiconductor (i.e., disposed at least partially within the p-type semiconductor of the image sensor layer). In some examples, this differential doping may create a variety of P-N junctions within image sensor 130 that may serve to facilitate production and/or conduction of electrical currents within image sensor 130. In at least one embodiment, the n-type semiconductor regions of image sensor elements 204 may be separated from the n-type semiconductor regions of light capture layer 132 by the p-type semiconductor region of image sensor layer surrounding image sensor elements 204.

For example, as shown in FIG. 2, light 104, which may include ambient light 104(a) and infrared light 104(b), may pass through incident layer 210 and into light capture layer 132. Within light capture layer 132, a first portion of light 104 having less than (i.e., shorter than) a predetermined wavelength (i.e., ambient light 104(a)) may interact with light capture layer 132, such as by causing electrons to flow across the junction between light capture layer 132 and image sensor layer 134 and/or a junction between light capture layer 132 and incident layer 210. This may cause an electrical current within light capture layer 132, which may flow via conduction pathway 206 to current sink 208, whereby the current may be contained and/or transferred out of from image sensor 130 and/or imaging device 100. Thus, the first portion of light 104 (i.e., ambient light 104(a)) may be captured within light capture layer 132. The first portion of light 104 (i.e., ambient light 104(a)) may thereby be prevented from entering image sensor layer 134 and/or interfering with an operation of image sensor elements 204(a)-(d).

Continuing with this example, a second portion of light 104 having at least the predetermined wavelength (i.e., a wavelength at least as long as the predetermined wavelength, such as infrared light 104(b)) may pass through (i.e., not interact with) light capture layer 132 to image sensor layer 134. From thence, the second portion of light may pass into one of image sensor elements 204 (e.g., image sensor element 204(c) as illustrated in FIG. 2), where the second portion of light may interact with the image sensor element 204 to produce a current from image sensor element 204. This current may pass via image sensor circuitry 212 to printed circuit board 140 and/or to any suitable detection, measurement, and/or collection device.

Returning to FIG. 1, in one embodiment, imaging device 100 may operate within a system, such as an artificial reality system 150. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality.

Artificial reality system 150 may be implemented on various platforms, including a head-mounted display connected to a host computer system, a standalone head-mounted display, a mobile device or computing system, or any other hardware platform capable of providing artificial reality content to one or more viewers. In some examples, a head-mounted-display device may be a display device or system that is worn on or about a user's head and displays visual content to the user. Head-mounted-display devices may be configured to be mounted to a user's head in a number of ways. Some head-mounted-display devices may be incorporated into glasses or visors. Other head-mounted-display devices may be incorporated into helmets, hats, or other headwear. Examples of head-mounted-display devices may include OCULUS RIFT, GOOGLE GLASS, VIVE, SAMSUNG GEAR, etc.

Figure 4:
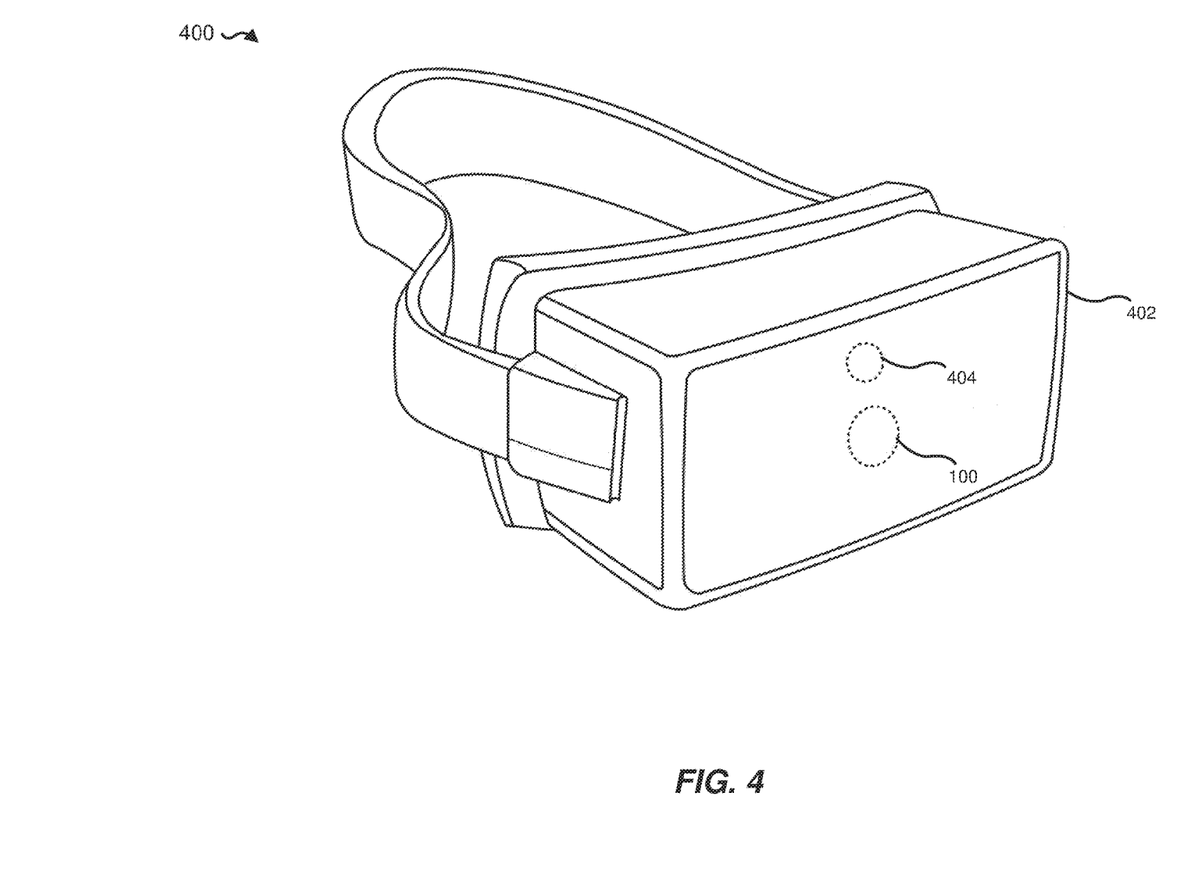
FIG. 4 is a perspective view of an exemplary head-mounted display, which may include the imaging device of FIG. 1, in accordance with some embodiments.
Figure 5:
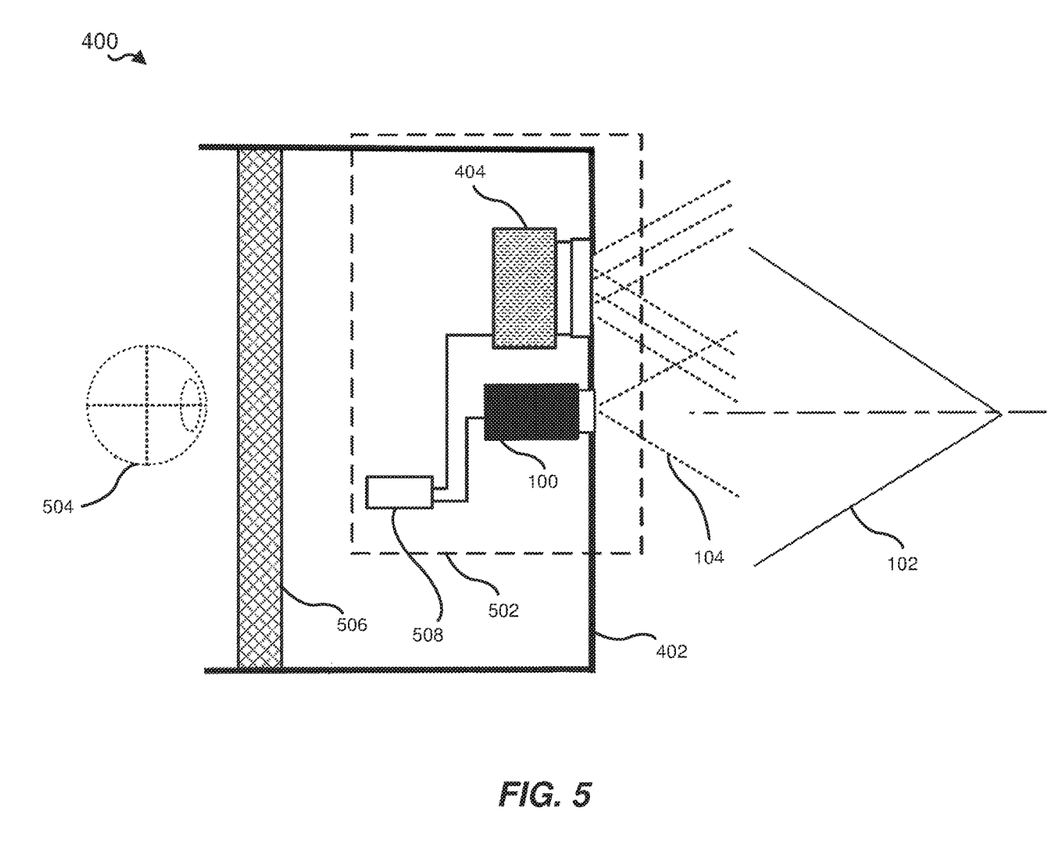
FIG. 5 is a cross-section of the head-mounted display in FIG. 4, in accordance with some embodiments.

Using FIG. 4 as a specific example, artificial reality system 150 may be implemented using a head-mounted display 400. In this example, imaging device 100 may be included within head-mounted display 400. As shown in FIG. 4, head-mounted display 400 may include a front rigid body 402 through which aperture 110 (included within imaging device 100 shown in FIG. 1) may receive light. In some such examples, imaging device 100 may operate within a local area imaging assembly, which may be included within head-mounted display 400, as illustrated in FIG. 5. In these examples, as will be discussed in greater detail in connection with FIG. 5, the local area imaging assembly may include an illumination source 404 which may emit light through front rigid body 402 of head-mounted display 400.

FIG. 5 represents a cross section of front rigid body 402 of head-mounted display 400. As shown in FIG. 5, head-mounted display 400 may include a local area imaging assembly 502. In some examples, local area imaging assembly 502 may be a device assembly configured to capture image data that is utilized in determining, mapping, and/or tracking position, orientation, and/or movement of objects within an area, such as local area 102 (e.g., an area surrounding head-mounted display 400). In some examples, local area imaging assembly 502 may include (1) imaging device 100 and (2) illumination source 404 configured to emit light (i.e., a carrier signal) into local area 102.

In some embodiments, local area imaging assembly 502 may determine depth and/or surface information for objects within local area 102 in a variety of ways. For example, local area imaging assembly 502 may be utilized in a SLAM tracking system to identify and/or map features of local area 102 and/or to identify a location, orientation, and/or movement of head-mounted display 400 and/or other objects (e.g., hand-held controllers, users, etc.) in local area 102. In some examples, illumination source 404 may be an active illuminant that emits a structured light pattern (e.g., a symmetric and/or quasi-random dot pattern, a grid pattern, horizontal bars, etc.) into local area 102. In these examples, local area imaging assembly 502 may determine the depth and/or surface information based on triangulation or perceived deformation of the emitted pattern. In one embodiment, local area imaging assembly 502 may capture ToF information describing the time required for light emitted from the illumination source to be reflected from one or more objects in local area 102 back to imaging device 100. In this embodiment, local area imaging assembly 502 may determine a distance between local area imaging assembly 502 and the objects based on the ToF information.

In some examples, information collected by local area imaging assembly 502 may be used as part of an image and/or video (e.g., an artificial reality image and/or video) displayed to a user wearing head-mounted display 400. In one example, shown in FIG. 5, the image and/or video may be displayed to a user (e.g., via an eye 504 of the user) via an electronic display 506. Electronic display 506 may represent a single electronic display or multiple electronic displays (e.g., a display for each eye of a user). Examples of electronic display 506 may include, without limitation, a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, a projector, a cathode ray tube, an optical mixer, and/or some combination thereof. The local area imaging assembly 502 may also include an imaging controller 508 that is coupled to illumination source 404 and/or imaging device 100.

In at least one embodiment, artificial reality system 150 shown in FIG. 1 may additionally or alternatively include controller tracking features (e.g., constellation tracking). For example, in addition to determining features of local area 102, local area imaging assembly 502 may track a position, orientation, and/or movement of one or more controller devices, such as hand-held controllers, that are utilized by a user for interacting with head-mounted display 400 and/or local area 102.

Figure 6:
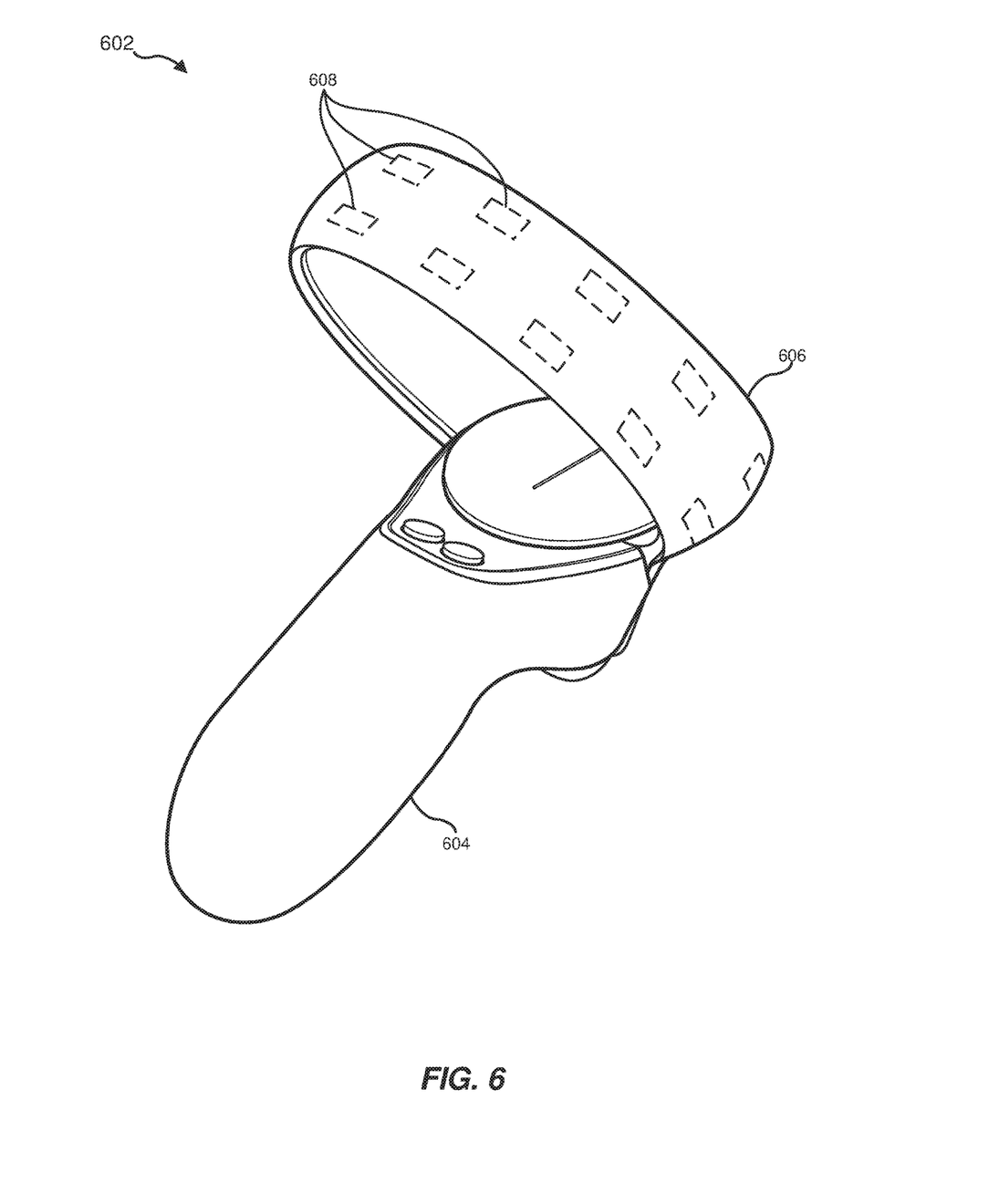
FIG. 6 is a perspective view of an exemplary hand-held controller utilized in artificial reality systems, in accordance with some embodiments.

FIG. 6 is a perspective view of an exemplary hand-held controller 602 that may be included in artificial reality system 150 in accordance with some embodiments. Artificial reality system 150 may include at least one hand-held controller 602. For example, artificial reality system 150 may include two hand-held controllers 602, with one hand-held controller 602 for each of a user's right and left hands. Each hand-held controller 602 may be communicatively coupled to head-mounted display 400 shown in FIGS. 4 and 5 and/or to a computing device (e.g., a personal computer, a console, etc.) communicatively coupled to head-mounted display 400. Hand-held controller 602 may be communicatively coupled to head-mounted display 400 via any suitable wireless and/or wired connection.

As shown in FIG. 6, hand-held controller 602 may include a grip 604 sized to fit within a user's right or left hand. Hand-held controller 602 may also include a tracking loop 606 for tracking position, orientation, and/or movement of hand-held controller 602 with respect to head-mounted display 400 and/or with respect to local area 102 shown in FIG. 5. For example, tracking loop 606 may include an array of tracking lights 608, such as tracking LEDs (e.g., IR LEDs), that are used for motion and positional tracking purposes to provide 360-degree motion control while using artificial reality system 150. Hand-held controller 602 may additionally or alternatively include tracking lights, such as tracking LEDs, on any other suitable portion of hand-held controller 602. In at least one embodiment, imaging device 100 may receive light emitted by tracking lights 608 on hand-held controller 602, such as tracking LEDs on tracking loop 606, and local area imaging assembly 502 may utilize the received light to determine location, orientation, and/or movement of hand-held controller 602.

According to some embodiments, local area imaging assembly 502 shown in FIG. 5 may be utilized as part of a hybrid system for (1) SLAM imaging to locate, map, and/or track features of local area 102 (e.g., using depth and/or surface information) and (2) controller tracking to determine location, orientation, and/or movement of one or more hand-held controllers 602 used by a user of artificial reality system 150. For example, local area imaging assembly 502 may receive and utilize light in an IR band (e.g., NIR light) for SLAM imaging of local area 102 and/or for IR tracking of at least one hand-held controller 602. In one example, illumination source 404 of local area imaging assembly 502 and/or hand-held controller 602 may emit light having wavelengths greater than approximately 700 nm via. For example, illumination source 404 of local area imaging assembly 502 and/or tracking lights 608 of hand-held controller 602 may emit light having wavelengths between approximately 710 nm to approximately 900 nm (e.g., approximately 710 nm, approximately 720 nm, approximately 730 nm, approximately 740 nm, approximately 750 nm, approximately 760 nm, approximately 770 nm, approximately 780 nm, approximately 790 nm, approximately 800 nm, approximately 810 nm, approximately 820 nm, approximately 830 nm, approximately 840 nm, approximately 850 nm, approximately 860 nm, approximately 870 nm, approximately 880 nm, approximately 890 nm, approximately 890 nm, approximately 900 nm, greater than approximately 900 nm). In one embodiment, illumination source 404 and/or tracking lights 608 of hand-held controller 602 may emit light having a wavelength of approximately 850 nm (e.g., between approximately 840 nm and approximately 860 nm).

In some embodiments, imaging device 100 may receive and utilize light emitted by illumination source 404 and reflected from local area 102 for SLAM imaging of local area 102. Additionally or alternatively, imaging device 100 may receive and utilize light emitted by hand-held controller 602 for tracking location, orientation, and/or movement of hand-held controller 602 relative to head-mounted display 800 and/or local area 102. Any other suitable ranges of light may be respectively utilized for SLAM imaging and/or controller tracking, where distinct ranges are utilized for each of the SLAM imaging and controller tracking purposes. In at least one embodiment, separate frames (e.g., alternating frames) captured by imaging device 100 may be respectively utilized by local area imaging assembly 502 for SLAM imaging and controller tracking as described herein. For example, one or more frames captured by imaging device 100 during a time period may be utilized for SLAM imaging and one or more frames captured by imaging device 100 during a subsequent time period may be utilized for controller tracking.

In some examples, a local area imaging assembly (e.g., local area imaging assembly 502) with one or more of the features described above may be disposed within an external sensor device for tracking and/or mapping features of local area 102, portions of artificial reality system 150 (e.g., head-mounted display 400, hand-held controllers 602, etc.), and/or one or more users and/or objects within local area 102. In some examples, the external sensor device may be a device that is used to detect the position, orientation, and/or motion of an additional device and/or object in a local area of the external sensor device. In one example, the local area imaging assembly may be utilized in an external sensor device that is separate from head-mounted display 400, such as an external sensor bar and/or other suitable external sensor device.

In some examples, the instant disclosure may include a system, such as artificial reality system 150, including a local area imaging assembly, which may include an imaging device, with at least one of the features discussed above. Also, in one embodiment, the instant disclosure may include a method for manufacturing, assembling, using, and/or otherwise configuring or creating a system with one or more of the features described herein.

Figure 7:
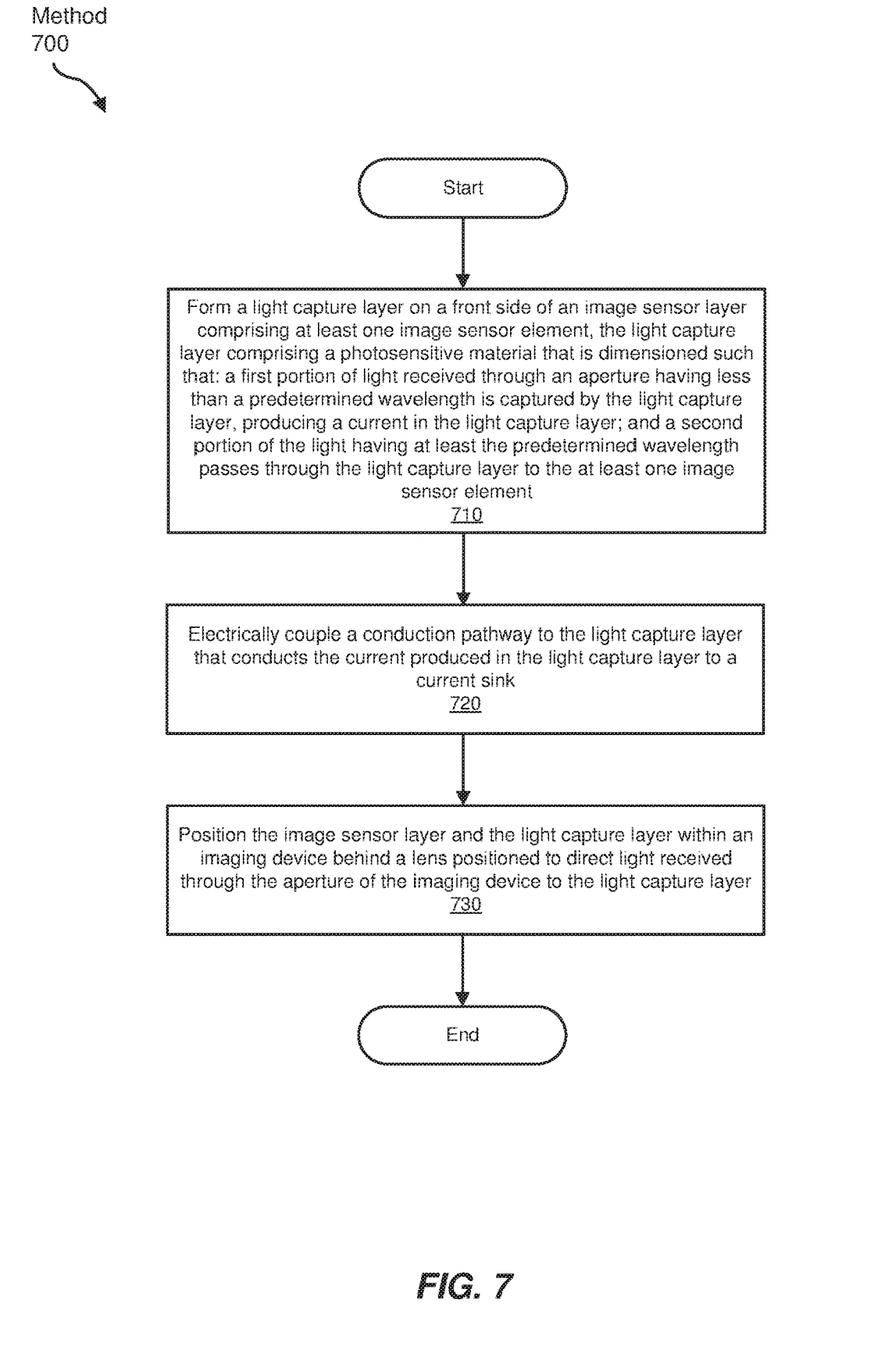
FIG. 7 is a flow diagram of an exemplary method for forming a light capture layer on a front side of an image sensor that suppresses ambient light in the image sensor in accordance with some embodiments.

FIG. 7 is a flow diagram of an example method 700 for constructing an image sensor that includes a light capture layer as described herein. As shown in FIG. 7, at step 710, the method may include forming a light capture layer on a front side of an image sensor layer. For example, light capture layer 132 may be formed on a front side of image sensor layer 134 (see, e.g., FIGS. 1 and 2). The image sensor layer may include at least one image sensor element, and the light capture layer may include a photosensitive material that is dimensioned such that a first portion of light received through an aperture having less than a predetermined wavelength is captured by the light capture layer, producing a current in the light capture layer, and a second portion of the light having at least the predetermined wavelength passes through the light capture layer to the at least one image sensor element. The image sensor element may be positioned to receive the second portion of the light that passes through the light capture layer. For example, light capture layer 132 may include a photosensitive material that is dimensioned such that a first portion of light 104 (e.g., ambient light 104(a)) received through aperture 110 having less than a predetermined wavelength is captured by light capture layer 132, and image sensor layer 134 may include at least one image sensor element 204 that receives a second portion of light 104 (e.g., infrared light 104(b)) (see, e.g., FIGS. 1 and 2).

The light capture layer may be formed on the front side of the image sensor layer in any suitable way. For example, both the light capture layer and the image sensor layer may be included as doped regions within a crystalline silicon die or substrate. These respective regions may be doped in accordance with any suitable doping process to introduce impurities into the regions. In some examples, the image sensor layer may be deposited on the image sensor layer—or vice versa—through any suitable deposition process and/or combination of deposition processes including, without limitation, physical vapor deposition (PVD), chemical vapor deposition (CVD), electrochemical deposition (ECD), molecular beam epitaxy (MBE) and more recently, atomic layer deposition, and so forth. In at least one example, where image sensor 130 may be a back illuminated sensor, a light capture layer may be implanted within image sensor 130 before the wafer stack (e.g., incident layer 210, light capture layer 132, image sensor layer 134, and/or back side wafer 214) is back-thinned to prepare image sensor elements 204 to be connected to image sensor circuitry 212. In some embodiments, the implantation process may be followed by an annealing process.

At step 720 in FIG. 7, the method may include electrically coupling a conduction pathway to the light capture layer that conducts the current produced in the light capture layer to a current sink. The conduction pathway may be electrically coupled to the light capture layer in any suitable way. For example, in embodiments where the conduction pathway may include a conductive metal, the conduction pathway may be electrically coupled to the light capture layer using any suitable metal-substrate coupling process. Further, the current sink may be any current sink as described herein. In at least some embodiments, the conductive pathway and current sink may conduct current produced in light capture layer (e.g., by ambient light 104(*a*)) out of the image sensor and/or the imaging device without the current sink or any other device detecting, sensing, measuring, or otherwise using current produced in the light capture layer (e.g., by ambient light 104(*a*)). In at least one embodiment, a back side wafer (e.g., back side wafer 214) may be etched to create a contact to ground that is electrically coupled to the current sink (e.g., back side contact 216 may be electrically coupled to current sink 208). This may create a grounding current path for current generated within the image capture layer (e.g., light capture layer 132) by ambient light (e.g., ambient light 104(*a*)) to be eliminated from image sensor 130.

At step 730 in FIG. 7, the method may include positioning the image sensor layer and the light capture layer within an imaging device behind a lens positioned to direct light received through the aperture of the imaging device to the light capture layer. For example, as illustrated in FIG. 1, image sensor 130, which includes image sensor layer 134 and light capture layer 132, may be positioned within imaging device 100 behind lens 120. And, lens 120 may be positioned behind aperture 110 to direct light 104 received by aperture 110 to image sensor elements (e.g., image sensor elements 204(*a*)-(*d*) illustrated in FIG. 2). In some examples, the method may also include placing the imaging device within an artificial reality headset, such as a virtual reality headset or an augmented reality headset, such as head-mounted display 400 illustrated in FIGS. 4 and 5, or in an external sensor device.

As discussed throughout the instant disclosure, the disclosed systems, methods, and devices may provide a light capture layer for an image sensor that prevents ambient light from passing through the light capture layer to an image sensor element disposed behind the light capture layer. The light capture layer may convert at least a portion of the ambient light to electric current. This electric current may then be conducted out of the system so that it may not interfere with other image sensing processes performed by the image sensor. Embodiments of this disclosure may thus use natural or induced photovoltaic properties of silicon included in the image sensor (e.g., the light capture layer) to absorb shorter wavelengths of light (e.g., ambient light) at or near the surface of the image sensor. This may provide for collection of longer wavelengths of light (e.g., infrared light) by image sensor elements disposed behind the light capture layer (i.e., image sensor elements 204 disposed within image sensor layer 134) without interference from the shorter wavelengths of light. Such a light capture layer may improve a signal-to-noise ratio of an imaging device used in a ToF depth sensing system. Additionally, embodiments of this disclosure may eliminate and/or reduce a need for an ambient-light-blocking filter in the imaging device, thus saving potential design and/or production costs that may be associated with adapting traditional filtering mechanisms to ToF depth sensing systems used in augmented and/or virtual reality systems. The light capturing features may also obviate the need for background light subtraction algorithms to remove ambient light, thus increasing the light collection efficiency of the imaging device.

The foregoing description, for purposes of explanation, has been described with reference to specific embodiments and has been provided to enable others skilled in the art to best utilize various aspects of the example embodiments disclosed herein. However, the illustrative discussions above are not intended to be exhaustive or to limit the scope of the claims to the precise forms disclosed. Many modifications and variations are possible in view of the above teachings without departing from the spirit and scope of the instant disclosure. The instant disclosure covers all modifications, equivalents, and alternatives falling within the scope of the appended claims. Features from any of the above-mentioned embodiments may be used in combination with one another in accordance with the general principles described herein. The embodiments were chosen to best explain the principles underlying the claims and their practical applications, to thereby enable others skilled in the art to best use the embodiments with various modifications as are suited to the particular uses contemplated. The embodiments disclosed herein should be considered in all respects illustrative and not restrictive. Reference should be made to the appended claims and their equivalents in determining the scope of the instant disclosure.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind." Unless otherwise noted, the terms "connected to," "coupled to," and "attached to" (and their derivatives), as used in the specification and claims, are to be construed as permitting both direct and indirect (i.e., via other elements or components) connection. Furthermore, two or more elements may be coupled together with an adhesive, a clasp, a latch, a hook, a link, a buckle, a bolt, a screw, a rivet, a snap, a catch, a lock, or any other type of fastening or connecting mechanism.

What is claimed is:

1. An imaging device comprising:
an aperture;
a lens positioned to direct light received through the aperture to a front side of an image sensor; and
the image sensor comprising:
a light capture layer comprising a photosensitive material that is dimensioned such that:
a first portion of the light having less than a predetermined wavelength is captured by the light capture layer, producing a current in the light capture layer; and
a second portion of the light having at least the predetermined wavelength passes through the light capture layer;
a conduction pathway, electrically coupled to the light capture layer, that conducts the current produced in the light capture layer to a current sink; and
an image sensor layer coupled to the light capture layer, the image sensor layer comprising at least one image sensor element positioned to receive the second portion of the light that passes through the light capture layer.

2. The imaging device of claim 1, wherein the current sink comprises at least one of:
a grounding terminal;
an open current drain;
an open current collector; or
a capacitor.

3. The imaging device of claim 1, further comprising image sensor circuitry electrically coupled to the at least one image sensor element, wherein the current sink is not electrically coupled to the image sensor circuitry.

4. The imaging device of claim 1, wherein:
the light capture layer comprises an n-type semiconductor;
the image sensor layer comprises a p-type semiconductor; and
the image sensor element comprises an additional n-type semiconductor disposed at least partially within the p-type semiconductor.

5. The imaging device of claim 1, wherein:
the image sensor further comprises an incident layer coupled to the light capture layer and positioned between the lens and the light capture layer; and
the incident layer passes the light from the lens to the light capture layer.

6. The imaging device of claim 5, wherein the incident layer comprises an additional p-type semiconductor.

7. The imaging device of claim 1, wherein:
the image sensor layer comprises a plurality of image sensor elements, the at least one image sensor element included in the plurality of image sensor elements; and
the light capture layer overlaps the plurality of image sensor elements.

8. The imaging device of claim 1, wherein the at least one image sensor element has a greater thickness in a direction of light flow through the image sensor than the light capture layer.

9. The imaging device of claim 1, further comprising a printed circuit board positioned behind the image sensor and electrically coupled to the at least one image sensor element.

10. The imaging device of claim 1, wherein the imaging device comprises part of a local area imaging assembly configured to track at least one object in an area surrounding the local area imaging assembly.

11. The imaging device of claim 1, wherein the imaging device comprises part of a local area imaging assembly configured to determine a depth between the local area imaging assembly and one or more objects in an area surrounding the local area imaging assembly.

12. The imaging device of claim 1, wherein the imaging device comprises part of at least one of:
a virtual reality headset; or
an augmented reality headset.

13. A system comprising:
a head-mounted display; and
an imaging device that comprises:
an aperture;
a lens positioned to direct light received through the aperture to a front side of an image sensor;
the image sensor comprising:
a light capture layer comprising a photosensitive material that is dimensioned such that:
a first portion of the light having less than a predetermined wavelength is captured by the light capture layer, producing a current in the light capture layer; and
a second portion of the light having at least the predetermined wavelength passes through the light capture layer;
a conduction pathway, electrically coupled to the light capture layer, that conducts the current produced in the light capture layer to a current sink; and
an image sensor layer coupled to the light capture layer, the image sensor layer comprising at least one image sensor element positioned to receive the second portion of the light that passes through the light capture layer.

14. The system of claim 13, wherein the current sink comprises at least one of:
a grounding terminal;

an open current drain;
an open current collector; or
a capacitor.

15. The system of claim 13, wherein:
the light capture layer comprises an n-type semiconductor;
the image sensor layer comprises a p-type semiconductor; and
the image sensor element comprises an additional n-type semiconductor disposed at least partially within the p-type semiconductor.

16. The system of claim 13, further comprising a printed circuit board positioned behind the image sensor and electrically coupled to the at least one image sensor element.

17. The system of claim 13, further comprising a local area imaging assembly that comprises the imaging device and an illumination source that emits light onto one or more objects in a local area such that the emitted light is reflected back to the local area imaging assembly after reaching the one or more objects, wherein:
the light received through the aperture comprises the light reflected back from the one or more objects; and
the local area imaging assembly is configured to determine a depth between the local area imaging assembly and the one or more objects based on the light reflected back from the one or more objects.

18. The system of claim 13, further comprising a hand-held controller that comprises at least one light-emitting element, wherein:
the light received through the aperture comprises light emitted by the at least one light-emitting element of the hand-held controller; and
the imaging device comprises part of a local area imaging assembly configured to track the hand-held controller based on the light emitted by the at least one light-emitting element of the hand-held controller.

19. The system of claim 13, wherein the head-mounted display comprises at least one of:
a virtual reality headset; or
an augmented reality headset.

20. A method comprising:
forming a light capture layer on a front side of an image sensor layer comprising at least one image sensor element, the light capture layer comprising a photosensitive material that is dimensioned such that:
a first portion of light received through an aperture having less than a predetermined wavelength is captured by the light capture layer, producing a current in the light capture layer; and
a second portion of the light having at least the predetermined wavelength passes through the light capture layer to the at least one image sensor element;
electrically coupling a conduction pathway to the light capture layer that conducts the current produced in the light capture layer to a current sink; and
positioning the image sensor layer and the light capture layer within an imaging device behind a lens positioned to direct light received through the aperture of the imaging device to the light capture layer.

* * * * *